United States Patent
Makkonen et al.

(10) Patent No.: US 10,756,696 B2
(45) Date of Patent: Aug. 25, 2020

(54) LATERAL BULK ACOUSTIC WAVE FILTER

(71) Applicant: VTT Technical Research Centre of Finland Ltd, Espoo (FI)

(72) Inventors: Tapani Makkonen, Espoo (FI); Tuomas Pensala, Espoo (FI); Markku Ylilammi, Espoo (FI)

(73) Assignee: VTT Technical Research Centre of Finland Ltd, Espoo (FI)

( * ) Notice: Subject to any disclaimer, the term of this patent is extended or adjusted under 35 U.S.C. 154(b) by 19 days.

(21) Appl. No.: 16/127,171

(22) Filed: Sep. 10, 2018

(65) Prior Publication Data
US 2020/0083863 A1  Mar. 12, 2020

(51) Int. Cl.
*H03H 9/02* (2006.01)
*H03H 9/13* (2006.01)
*H01L 41/047* (2006.01)
*H03H 9/17* (2006.01)
*H03H 9/54* (2006.01)
*H03H 9/56* (2006.01)

(52) U.S. Cl.
CPC ..... *H03H 9/02228* (2013.01); *H01L 41/0471* (2013.01); *H03H 9/02015* (2013.01);
(Continued)

(58) Field of Classification Search
CPC .... H03H 9/547; H03H 9/173; H03H 9/02015; H03H 9/02228; H03H 9/564; H03H 9/132; H01L 41/0471
(Continued)

(56) References Cited

U.S. PATENT DOCUMENTS

| 9,893,712 B2 | 2/2018 | Meltaus et al. |
| 2013/0057360 A1* | 3/2013 | Meltaus ............ H03H 9/02228 333/187 |

(Continued)

FOREIGN PATENT DOCUMENTS

| WO | WO 2001/06647 | 1/2001 |
| WO | WO 2011/131844 | 10/2011 |

(Continued)

OTHER PUBLICATIONS

Fattinger et al. "Optimization of acoustic dispersion for high performance thin film BAW resonators," Proc. IEEE International Ultrasonics Symposium, 2005, pp. 1175-1178.
(Continued)

*Primary Examiner* — Robert J Pascal
*Assistant Examiner* — Jorge L Salazar, Jr.
(74) *Attorney, Agent, or Firm* — Fish & Richardson P.C.

(57) ABSTRACT

Acoustic wave filter devices is disclosed. The device includes a piezoelectric layer, an input electrode and an output electrode located on a top surface of the piezoelectric layer and physically separated from one another, and a counter electrode having a top surface connected to a bottom surface of the piezoelectric layer. The input and output electrodes each include a base and at least one extension extending from the base. The at least one extension of the input electrode extending alongside and in a generally opposite direction to and separated by a gap width from an adjacent extension of the at least one extensions of the output electrode. In some embodiments, the at least one extension of the input or output electrodes has a width that can changes from a first end of the at least one extension to a second end.

20 Claims, 13 Drawing Sheets

(52) U.S. Cl.
CPC ............ *H03H 9/132* (2013.01); *H03H 9/173* (2013.01); *H03H 9/547* (2013.01); *H03H 9/564* (2013.01)

(58) Field of Classification Search
USPC .................... 333/133, 186, 187, 193–196
See application file for complete search history.

(56) References Cited

U.S. PATENT DOCUMENTS

| | | | |
|---|---|---|---|
| 2013/0278356 | A1 | 10/2013 | Meltaus et al. |
| 2013/0321100 | A1* | 12/2013 | Wang .................... H03H 9/584 333/187 |
| 2014/0312994 | A1 | 10/2014 | Meltaus et al. |
| 2015/0270826 | A1 | 9/2015 | Burak |

FOREIGN PATENT DOCUMENTS

| | | |
|---|---|---|
| WO | WO 2012/049372 | 4/2012 |
| WO | WO 2012/049374 | 4/2012 |
| WO | WO 2013/068652 | 5/2013 |

OTHER PUBLICATIONS

Meltaus et al., "Laterally coupled solidly mounted BAW resonators at 1.9 GHz," Proc. IEEE International Ultrasonics Symposium, 2009, pp. 847-849.

Meltaus and Pensala, "Laterally coupled BAW filters with 5% bandwidth," Proc. IEEE International Ultrasonics Symposium, 2010, pp. 966-969.

Meltaus and Pensala, "Laterally coupled BAW filter using two acoustic modes," IEEE 2013 Joint UFFC, EFTF and PFM Symposium, pp. 232-235.

Pensala et al., "2-D modeling of laterally acoustically coupled thin film bulk acoustic wave resonator filters," IEEE Transactions on Ultrasonics, Ferroelectrics, and Frequency Control, Nov. 2010, 57(11):2537-2549.

Solie, "Tapered transducers—design and applications," Proc. IEEE International Ultrasonics Symposium, 1998, pp. 27-37.

PCT International Search Report and Written Opinion in International Appln. No. PCT/EP2019/073998, dated Dec. 9, 2019, 17 pages.

Wang et al, "FBAR Laterally Coupled Resonator Filter" IEEE International Ultrasonics Symposium Oct. 2015, pp. 1-5.

* cited by examiner

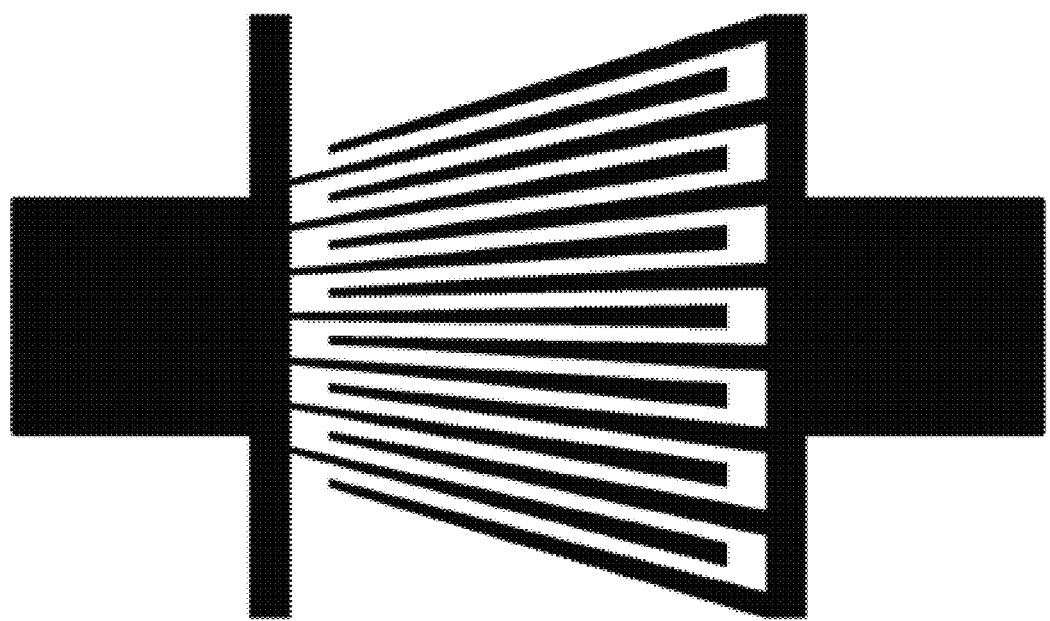
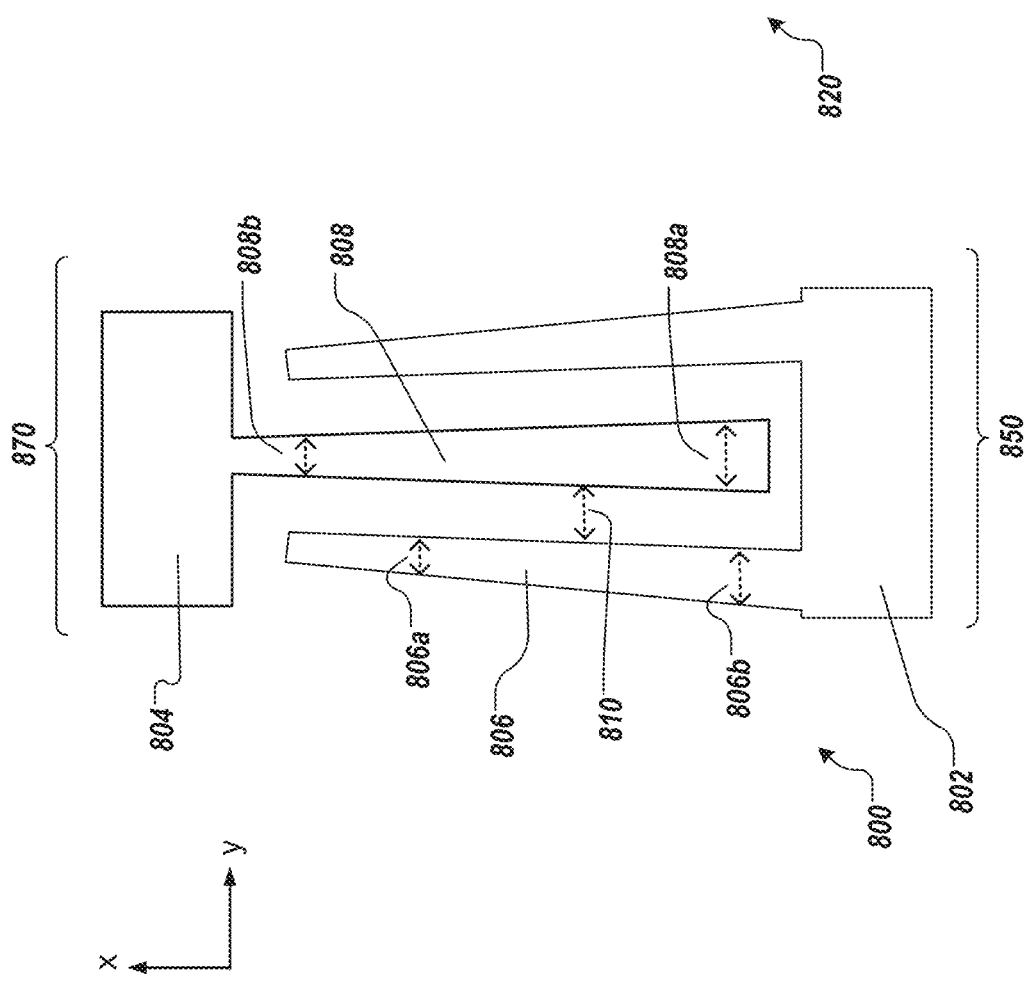

LATERAL BULK ACOUSTIC WAVE FILTER

BACKGROUND

Technical Field

This specification relates to thin film radio-frequency acoustic wave filters.

Background

Radio-frequency ("RF") components, such as resonators and filters, based on microacoustic and thin-film technology are widely used in radio applications such as: mobile phones, wireless networks, satellite positioning, etc. Their advantages over their lumped-element, ceramic, and electromagnetic counterparts include small size and mass-production capability.

SUMMARY

This specification describes technologies for Lateral Bulk Acoustic Wave ("LBAW") filters. In the present disclosure, LBAW filters include an input and an output resonator formed from a piezoelectric layer sandwiched between two pairs of electrodes. LBAW filters are formed from a piezoelectric layer sandwiched between two pairs of electrodes. One electrode from each pair is located on the top surface of the piezoelectric layer, and forms an input or an output of the LBAW. The input and output electrodes are separated by a gap. Each pair also has a counter electrode located on the bottom surface of the piezoelectric layer. By applying an alternating voltage across the piezoelectric layer at the input resonator, a mechanical resonance is formed in the piezoelectric layer below the input electrode. The piezoelectric layer thickness and the gap between electrodes can be designed such that this mechanical resonance is coupled across the gap to the output resonator. The frequency range at which such coupling occurs determines the achievable bandwidth (or width of passband) for the LBAW filter.

In general, one innovative aspect of the subject matter described in this specification can be embodied in an acoustic wave filter device that includes a piezoelectric layer, an input electrode and an output electrode located on a top surface of the piezoelectric layer and physically separated from one another, and a counter electrode having a top surface connected to a bottom surface of the piezoelectric layer. The input and output electrodes each include a base and at least one extension extending from the base. The at least one extension of the input electrode extending alongside and in a generally opposite direction to and separated by a gap width from an adjacent extension of the at least one extensions of the output electrode. Thickness of the piezoelectric layer and the gap width between adjacent extensions of the input and output electrodes are such that application of a radio frequency voltage between the input electrode and the counter electrode will create symmetric and antisymmetric acoustic thickness-extensional resonance modes in the piezoelectric layer. The at least one extension of the input or output electrodes has a width that changes from a first end of the at least one extension to a second end.

The foregoing and other embodiments can each optionally include one or more of the following features, alone or in combination.

The first end of the extension may be proximal to the base of the corresponding electrode, and the second end of the extension may be distal from the base of the corresponding electrode. The at least one extension of one of the input or output electrodes may have a width that decreases from the first end of the at least one extension to the second end. In some examples, the at least one extension of the other of the input or output electrodes has a width that increases from the first end of the at least one extension to the second end. The at least one extension of the input electrode can increase in width from the first end to the second end of the least one extension of the input electrode, and the at least one extension of the output electrode can decrease from the first end to the second end of the least one extension of the output electrode. The at least one extension of one of the input or output electrodes can have a width that increases from a first end of the at least one extension to a second end.

In some embodiments, the gap width between extensions is constant. In some embodiments, the width of the at least one extension of the input or output electrodes changes continuously from a first end of the at least one extension to a second end.

In some embodiments, the input and output electrodes each have a comb structure with interdigitated extensions. In some examples, the input and output electrodes have at least 10 extensions.

The acoustic wave filter can further include a Bragg reflector in contact with a bottom surface of the counter electrode.

In some embodiments, the piezoelectric layer thickness is at least 0.5 µm. The width of each extension may increase between 20% and 250% from a first end of at least one extension to a second end. The width of each extension may increase by between 25% and 100% from the first end to the second end. In some embodiments, the width of each extension increases from 4 µm to 5 µm from the first end to the second end.

The acoustic wave filter can be a laterally coupled bulk acoustic wave filter.

One innovative aspect of the subject matter described in this specification can be embodied in an acoustic wave filter device that includes a piezoelectric layer, an input electrode and an output electrode located on a top surface of the piezoelectric layer and physically separated from one another, and a counter electrode having a top surface connected to a bottom surface of the piezoelectric layer. The input and output electrodes each include a base and at least one extension extending from the base. The at least one extension of the input electrode extending alongside and in a generally opposite direction to and separated by a gap width from an adjacent extension of the at least one extensions of the output electrode. Thickness of the piezoelectric layer and the gap width between adjacent extensions of the input and output electrodes are such that application of a radio frequency voltage between the input electrode and the counter electrode will create symmetric and antisymmetric acoustic thickness-extensional resonance modes in the piezoelectric layer. The gap width between adjacent extensions of the input and output electrodes changes between the base of the input electrode and the base of the output electrode.

The foregoing and other embodiments can each optionally include one or more of the following features, alone or in combination.

In some embodiments, the gap width between adjacent extensions of the input and output electrodes increases between the base of the input electrode and the base of the output electrode. In some examples, the gap width between adjacent extensions of the input and output electrodes increases from 2 µm to 3 µm.

In some embodiments, the gap width between adjacent extensions of the input and output electrodes decreases between the base of the input electrode and the base of the output electrode.

The input and output electrodes each can have a comb structure with interdigitated extensions.

The subject matter described in this specification can be implemented in particular embodiments so as to realize one or more of the following advantages. LBAW filters described herein can be simpler to fabricate because they use only a single piezoelectric layer as compared to two in vertically stacked bulk acoustic wave (BAW) coupled resonator filters. LBAW filters can also operate at higher frequencies as surface acoustic wave (SAW) filters as their operation is determined more by piezoelectric layer thickness than IDT electrode dimensions. In some embodiments, LBAW filters can also achieve a wider bandwidth than BAW filters. LBAW filters can perform as filters with a single lithographic patterning step as compared to multiple (close to 10) lithographic steps used in BAW and can operate without reflectors needed in SAW, and thus is smaller in size.

In some embodiments, LBAW filters can be designed to suppress side bands. In some embodiments, LBAW filters can be designed to reduce ripple in the passband.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 8A is a schematic top view of a section of a fan-shaped LBAW electrode with tapered extensions.

FIG. 8B is a schematic top view of a fan-shaped LBAW electrode with tapered extensions.

Like reference numbers and designations in the various drawings indicate like elements.

DETAILED DESCRIPTION

Figure 1A:
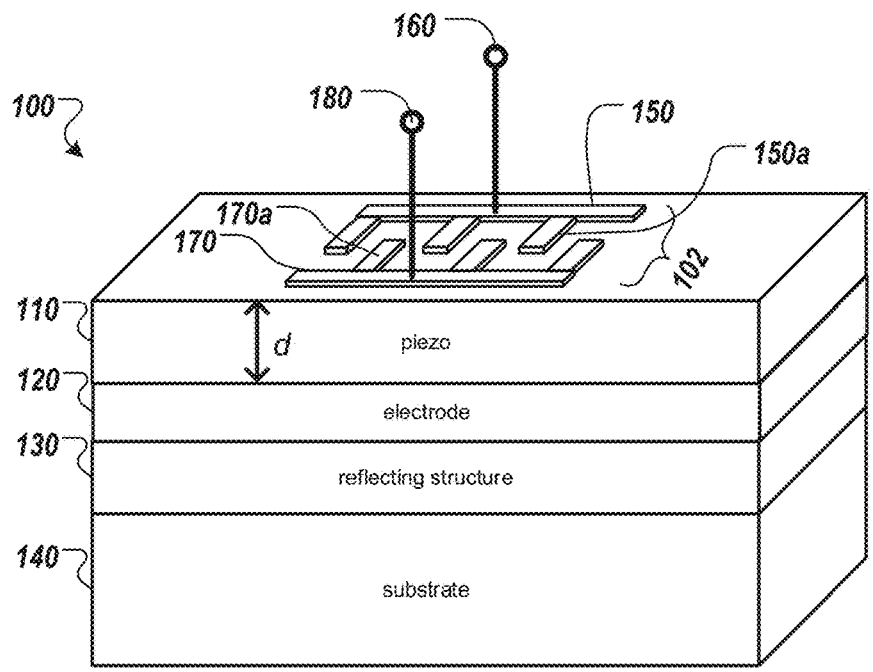
FIG. 1A is a schematic perspective view of a solidly-mounted LBAW filter.
Figure 1B:
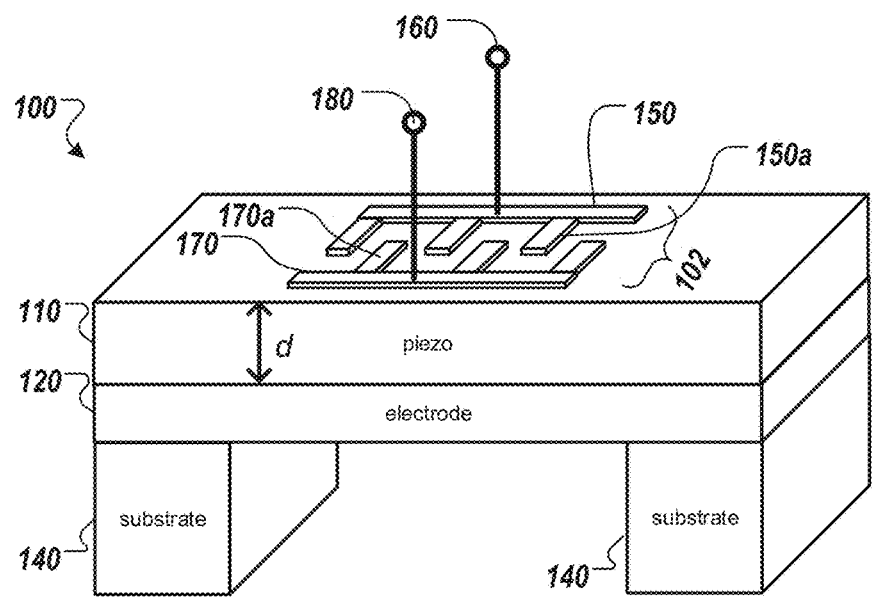
FIG. 1B is a schematic perspective view of a self-supported LBAW filter.
Figure 1C:
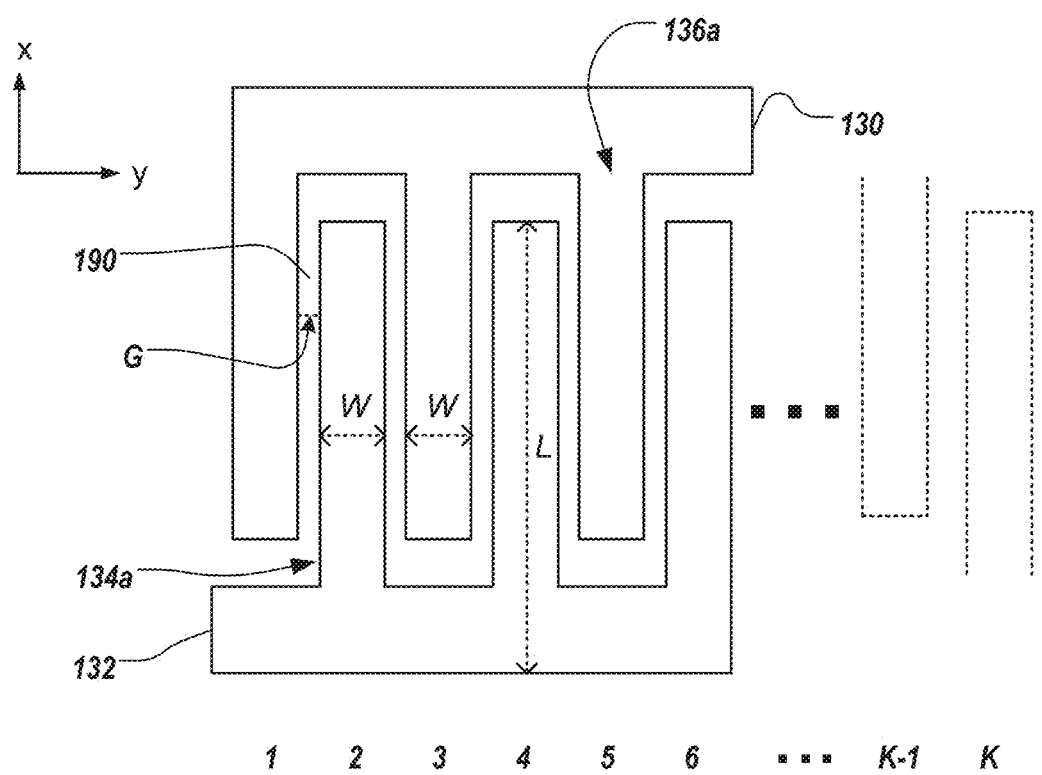
FIG. 1C is a schematic planar view of an IDT electrode structure.

FIGS. 1A, 1C show an example of an LBAW filter (or resonator) 100 with input 150 and output 170 electrodes that have an interdigitated geometry (also called "interdigital transducer" or "IDT" LBAW). LBAW filter 100 includes a piezoelectric ("piezo") layer 110, having a thickness d, an IDT electrode structure 102 located on the top surface of the piezo layer, and a bottom counter electrode 120 located on the bottom surface of the piezo layer. IDT electrode structure ("IDT") 102 includes two comb-shaped electrodes, 150 and 170, of conductive material, e.g., metal or polysilicon. IDT electrodes 150 and 170 have parallel extensions 150a and 170a, respectively, that provide the "tines" or "teeth" or "fingers" of the "comb." Electrode 150 and counter electrode 120 form an input resonator with piezo layer 110. Electrode 170 and counter electrode 120 form an output resonator with piezo layer 110.

Acoustic vibrations are created in piezo layer 110 by applying an oscillating (or alternating) input voltage across IDT electrode 150 and bottom counter electrode 120 at an input port 160. The applied voltage is transformed into a mechanical (e.g., acoustic) vibration via the piezoelectric effect. Under resonance conditions (e.g., with certain acoustic resonance modes, as detailed further below), this vibration can create a standing wave under input electrode 150 and an evanescent wave (with exponentially decaying amplitude) in the gap region 190. With appropriate selection of vibration frequencies and gap width G, the standing wave can be coupled mechanically across gap 190 from the piezo region under electrode 150 to piezo region under electrode 170 by the evanescent wave and create a similar standing wave in piezo layer 110 under electrode 170. The standing wave under electrode 170 results in an output signal voltage with the same frequency at an output port 180 via the reverse piezoelectric effect. The frequency range at which this coupling occurs in mechanical resonance with strong piezoelectric coupling forms the passband (or bandwidth) of LBAW filter 100. In some example, the frequency range is between 1.8 and 1.95 GHz. As discussed further below, the thicknesses and geometries, and spacing of the various layers of LBAW 100 can be tuned to change the RF response and passband of the filter.

A reflecting structure 130 can serve to isolate the vibration in piezo layer 110 from an underlying substrate 140 and to prevent acoustic leakage. The reflecting structure can be a stack of thin layers, for example, a Bragg reflector composed of alternating high and low acoustic impedance ("$Z_{ac}$") material layers. The thickness of these layers can be designed such that the frequencies with and near the passband of LBAW filter are reflected back into piezo layer 110 and all other frequencies pass through the mirror.

In some embodiments, LBAW 100 is does not directly overlie substrate 140 (as shown in FIG. 1A), but is self-supported, as shown in FIG. 1B. In such an arrangement, substrate 140 and mirror 130 are replaced by an air gap, with portions of piezo that extend laterally past the region in which LBAW 100 is fabricated being supported by substrate 140.

In some embodiments, as shown in FIG. 1C, extensions 150*a* and 170*a* are rectangular and have a width W, length L, and are spaced by gap width G. Each electrode 150 and 170 has one or more extensions 150*a* and 170*a* respectively. The total number of electrode extensions is designated as K.

Although FIG. 1C shows rectangular interdigital electrodes 150/170 with parallel extensions 150*a*/170*a* of same geometry and spacing G, other electrode geometries are also contemplated. Design considerations include the gap between electrodes, the length of the electrode, and the number, if any, and shape of electrode extensions. The gap can be used to control coupling between the input and output electrodes. Longer electrodes can also increase coupling. The number of extensions K can be used to control the bandwidth and/or to increase coupling while conserving the area taken up by the electrodes. In some embodiments, the electrodes are composed of rectangular strips, with two or more extensions (e.g., K≥2). For example, each extension can be a rectangular strip. In some embodiments, the electrodes are concentric circles or spirals having a common axis.

Piezo layer 110 can be formed from various piezoelectric materials. Exemplary materials include ZnO, AlN, CdS, PZT, LiNbO$_3$, LiTaO$_3$, quartz, KNN, BST, GaN, Sc alloyed AlN, or the aforementioned materials doped or alloyed with an additional element. Doping can be used to improve or tailor electromechanical properties of piezo layer 110. As detailed further below, piezo layer thickness d is selected such that thickness-extensional modes near the frequencies of the desired bandwidth of the LBAW filter are produced in the piezo layer. In some embodiments, piezo layer thickness d is 20% to 50% of $\lambda_z$, or 30% to 45% of $\lambda_z$, where $\lambda_z$ is the wavelength of the piezoelectric vibration in the thickness direction. In some embodiments, d is 1500 nm to 2500 nm, or 1800 to 2200 nm.

Thin film IDT 102 can be composed of various materials. In some embodiments, IDT electrodes 150 and 170 are metal. For example, the electrode material can include Al, Mo, Pt, Cu, Au, Ag, Ti, W, Ir, Ru, or multilayers of metals and/or metals doped with additional materials, e.g., AlSi, AlSiCu, polysilicon, etc. Doping can be used to improve or tailor IDT electric or mechanical properties.

Although FIG. 1A shows a single common counter electrode 120, filter 100 can include separate electrodes for the input and output resonators. Various materials are suitable for the counter electrode(s) (e.g., electrode 120). For example, the electrodes can include a metal, such as Al, Mo, Pt, Cu, Au, Ag, Ti, W, Ir, Ru, or multilayers of metals and/or metals doped with additional materials, e.g., AlSi, AlSiCu, etc. Doping can be used to improve or tailor IDT electric or mechanical properties. For example, the electrodes can be Ti+Mo, Ti+W, AlN+Mo, or Al+W. The electrodes can be multilayered. The electrodes can have a special thin seed layer deposited below the electrode.

Reflecting structure 130 can be composed of alternating layers of different materials. For example, reflecting structure 130 can include alternating layers of two of: tungsten (W), SiO$_2$, silicon (Si), and carbon (C). For example, layers of high acoustic impedance include W, Mo, Ir, Al$_2$O$_3$, diamond, Pt, AlN, Si$_3$N$_4$. Layers of low acoustic impedance can include SiO$_2$, glass, Al, Ti, C, polymers, or porous materials. Layer of Si provides an intermediate acoustic impedance. Various materials are suitable for the substrate 140, such as Si or SiO$_2$ or glass, sapphire, quartz. Substrate 140 materials can have high electrical resistivity. The substrate can have a thickness appropriate for RF applications, such as integration into mobile phone platforms. For example, the substrate can have a thickness less than 500 microns, or less than 200 microns. For example, Si wafers can be purchased with a thickness of 675 μm and thinned down to a achieve desired device thickness, e.g., for mobile platforms.

Modeling of the acoustic response of LBAW 100 can provide guidance on how to tune the design parameters for individual elements of the structure to achieve desired bandpass properties. For example, LBAW 100 can be designed to have resonance modes at specific frequencies. In general, the geometry of various LBAW 100 components can be selected to achieve various acoustic properties. LBAW 100 properties can depend on the combination of these geometries, which may not be independent of one another.

Figure 2A:
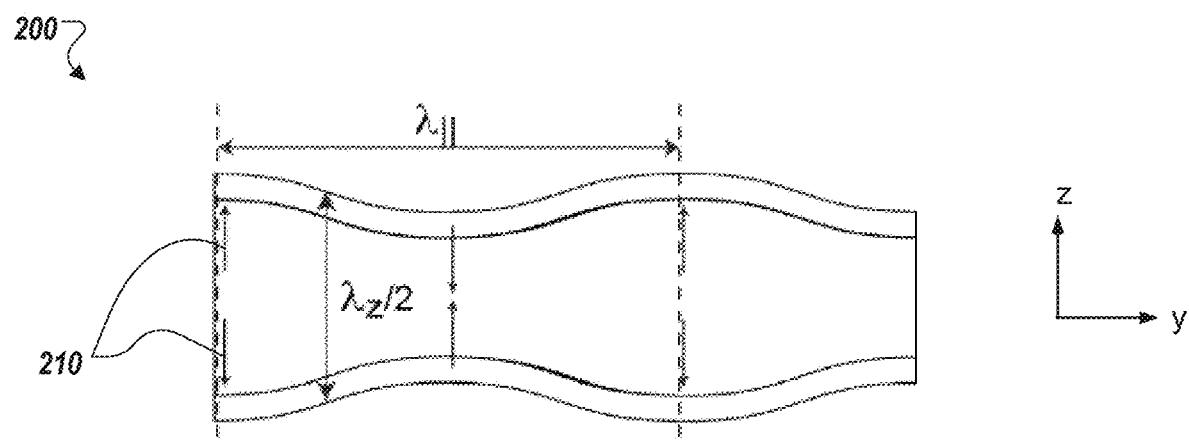
FIGS. 2A-B are schematic diagrams of two types of propagating plate wave modes in LBAW piezo layer.
Figure 2B:
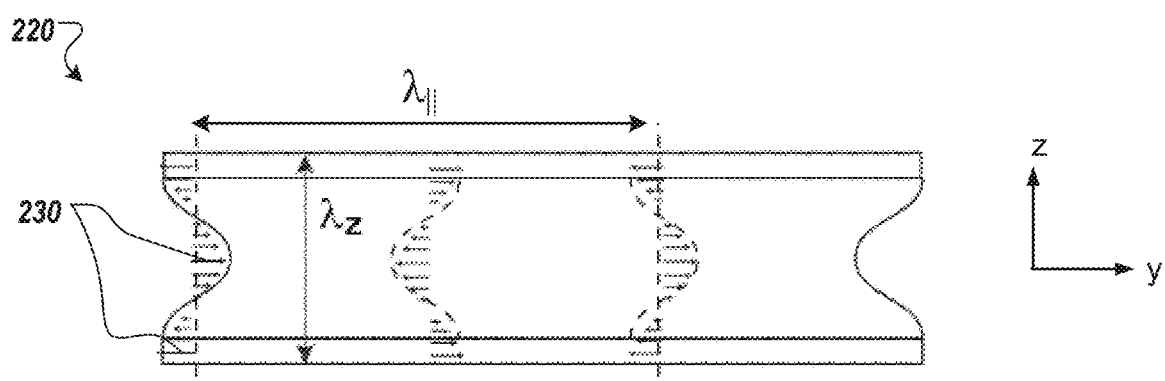

In piezoelectric layer 110, different bulk acoustic vibration modes can arise at different excitation frequencies f of input voltage (e.g., at port 160). Acoustic vibrations in piezo layer 110 can propagate laterally as Lamb waves (or plate waves), wherein particle motion lies in the plane that contains the direction of wave propagation and the plate normal (e.g., the z-axis in FIG. 1A). Two such modes are shown in FIGS. 2A-2B. Referring to FIG. 2A, a thickness-extensional (TE or longitudinal) bulk mode 200 has particle displacement 210 perpendicular to the propagation direction (in the z-direction). Referring to FIG. 2B, a second order thickness-shear (TS2) bulk mode 220 has particle displacement 230 parallel to the propagation direction (in the y-direction). For both modes, the lowest frequency at which resonance in the thickness direction can arise is when the thickness d of piezo layer 110 is equal to an integer number of half wavelengths $\lambda_z$ (disregarding the thickness of electrodes 150/170); in other words, when $$d = \frac{N\lambda_z}{2},$$

where N is an integer that indicates the order of the resonance. For the TE1 mode, $$d = \frac{\lambda_z}{2}.$$

As discussed further below, the width W of the electrodes and the gap G between electrodes can be designed such that TE1 mode standing waves with certain lateral wavelengths $\lambda_\parallel$ are formed that can couple through their evanescent tails across gap G to create two mechanical resonant modes.

Figure 3:
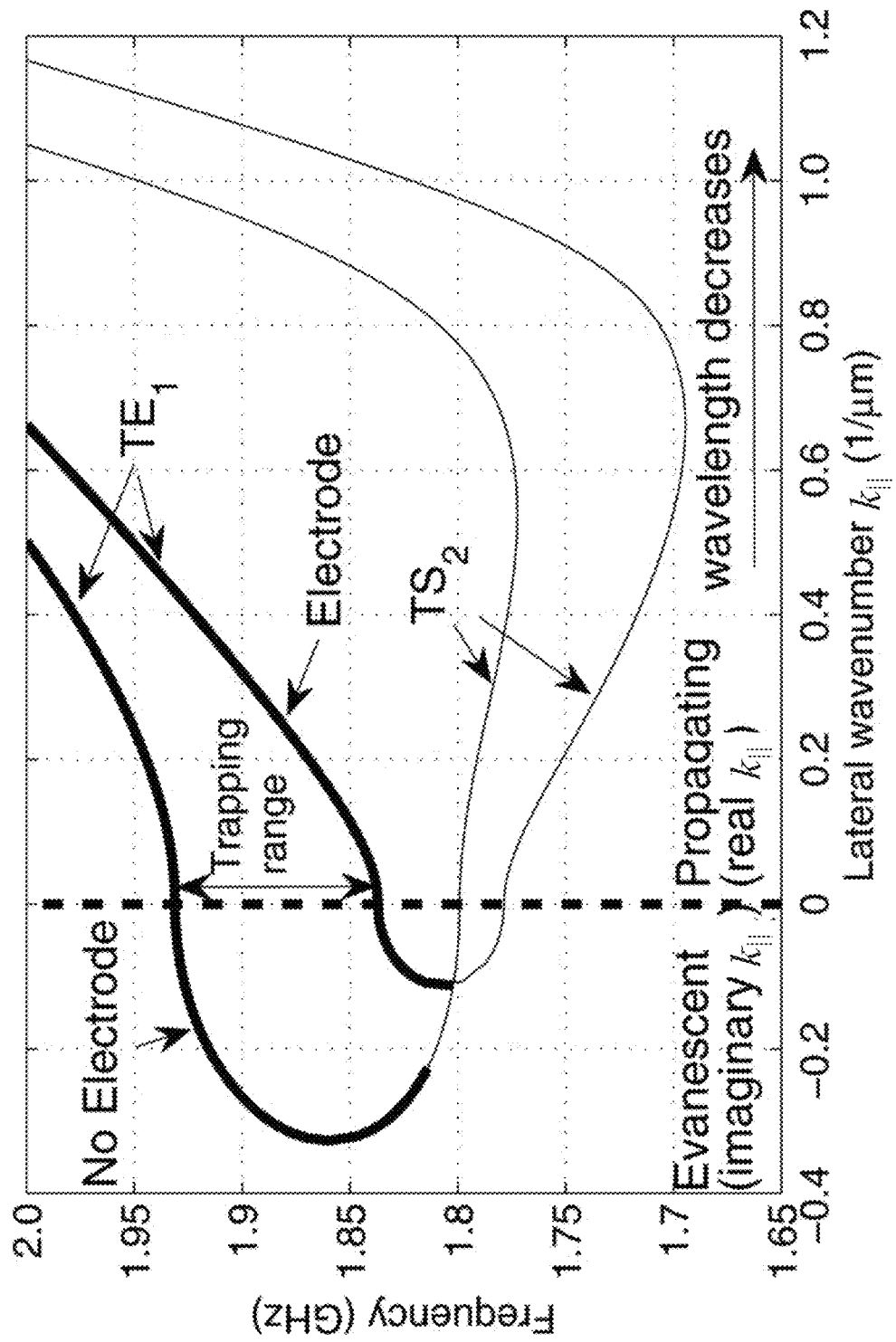
FIG. 3 is a dispersion curves for an exemplary LBAW.

Acoustic properties of an LBAW resonator 100 can be described with dispersion curves. Referring to FIG. 3, an example dispersion curve for an LBAW 100 shows the lateral wave number $k_\parallel$ of the vibration, where $$k_\parallel = \frac{2\pi}{\lambda_\parallel},$$

as a function of frequency f. The first-order longitudinal (thickness extensional, TE1) vibration mode, in which the combined thickness of the piezoelectric layer d and the thickness of electrode(s) 150 or 170 contains approximately half a wavelength of the bulk vibration, $\lambda_z/2$, and the second-order thickness shear (TS2) mode, in which the bulk vibration is perpendicular to the thickness direction (z-axis in FIG. 2B) and approximately one acoustic wavelength $\lambda_\parallel$ is contained in the combined piezoelectric layer thickness d and the thickness of electrode(s) 150 or 170, are denoted in the figure. The TE1 mode is the darker portion of each dispersion curve, and TS2 mode is the lighter region of each dispersion curve. The top curve ("no electrode") represents the dispersion properties of the piezoelectric layer under the gap 190. The bottom curve ("electrode") represents the dispersion properties of the piezoelectric layer under electrodes 150/170, also known as the active region. More specifically, where the "electrode" curve intersects k=0, the TE1 mode has approximately $\lambda_z/2$ contained in the combined thickness of the electrodes 150 or 170 and the piezoelectric layer. This is approximate because the wave can extend into the Bragg reflector. "No Electrode" curve intersection with k=0 lines shows the modes where approximately $\lambda_z/2$ is contained in the combined thickness of the bottom electrode only and the piezolayer. This type of dispersion, in which the TE1 mode has increasing $k_\parallel$ with increasing frequency f, is called Type 1. The difference in intersect $k_\parallel$=0 frequencies between electrode and non-electrode areas determined the hard limits for the achievable bandwidth of the filter. The gap width G, electrode width W, and number of extensions K can be used to vary the coupling strength within the limits set by the dispersion difference.

In some embodiments, LBAW 100 can be designed to produce Type 1 dispersion. For example, piezo layer 110 materials can be selected in which Type 1 dispersion can occur. For example, ZnO can be used. In another example, appropriate design of acoustic Bragg reflector 130 can help achieve Type 1 dispersion. For example, using Aluminum nitride ("AlN") for piezo layer 110 can typically produce a Type 2 dispersion, where TE1 mode behaves non-monotonically having initially decreasing $k_\parallel$ with increasing frequency f, and then increasing $k_\parallel$ with increasing frequency f, (roughly similar to what is described in the dispersion curves of in FIG. 3 but with TE1 and TS2 interchanged). However, in some embodiments, with an appropriate design of the reflecting structure 130 (e.g., acoustic Bragg reflectors), the LBAW 100 can use AlN in piezo layer 100 and still achieve a Type 1 dispersion. See for example Fattinger et al. "Optimization of acoustic dispersion for high performance thin film BAW resonators," Proc. IEEE International Ultrasonics Symposium, 2005, pp. 1175-1178.

In FIG. 3, positive values of kH denote real wave numbers (propagating waves) and negative $k_\parallel$ values correspond to imaginary wave numbers (evanescent waves). For a resonance to arise, the acoustic energy must be trapped inside the LBAW resonator structure. In the thickness (z-axis) direction, isolation from the substrate (using reflecting structure 130) can be used for energy trapping. In the lateral direction, energy trapping can occur when an evanescent wave forms outside the electrode region (e.g., on the "no electrode" curve). To get resonant coupling between the two resonators (e.g., electrodes 150/170 and 120) of an LBAW, standing waves of a TE1 mode form in the active regions of the piezo layer (under the electrodes), and evanescent waves form in the "no electrode" region. In other words, $k_\parallel$ is positive for the TE1 "electrode" curve and negative for the TE1 "no electrode" curve. According to FIG. 3, this occurs in the labeled "trapping range" frequency range. Energy trapping can be easier to realize in Type I dispersion. Without wishing to be bound by theory, with monotonically increasing dispersion curves as the thick TE1 lines in FIG. 3, for the "Electrode", at a single frequency in the trapping range there is either a single imaginary wave number available or above the trapping range a single real wave number. The former means that the TE1 does not propagate outside the electrode and the latter that the TE1 can couple to a propagating wave outside the electrode and thus "leak". The Type 2 dispersion can be described by similar curves but with the TE1 and TS2 curves interchanged. The fact that the curve in Type 2 is non-monotonic means that at a given frequency there may be several real wavenumbers. Having several wavenumbers for a frequency means propagating waves are available outside the electrode, which can cause a "leak".

Figure 4A:
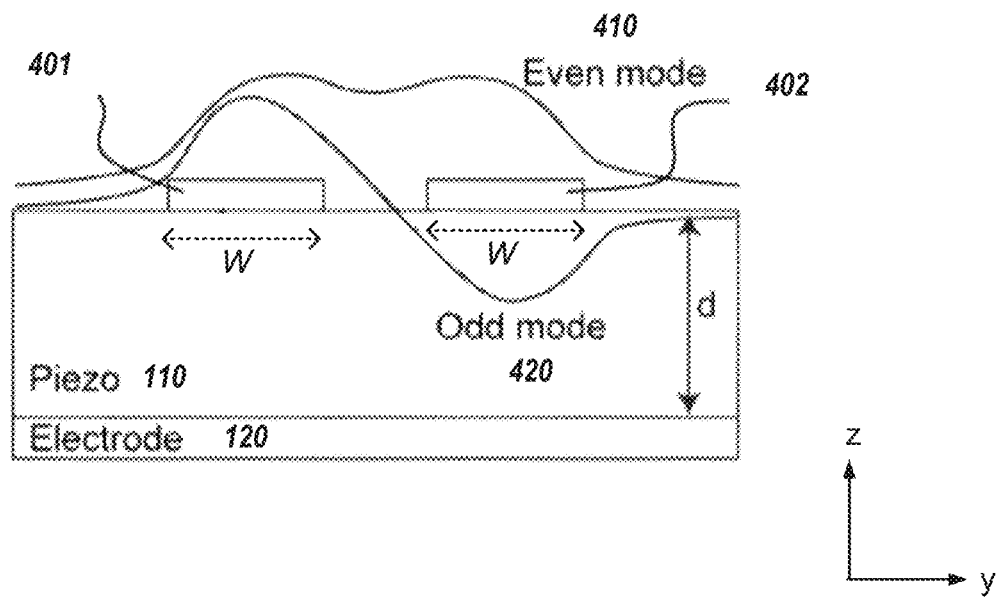
FIG. 4A is a schematic diagram of two resonant modes in an LBAW.
Figure 4B:
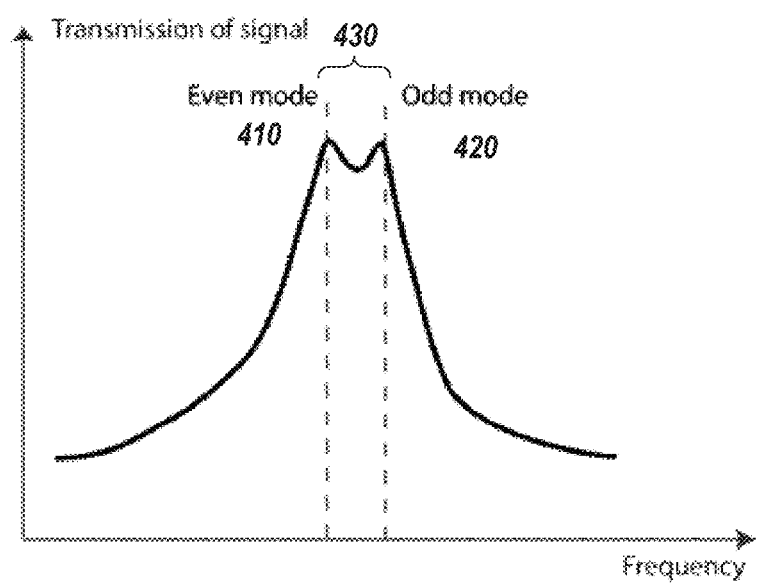
FIG. 4B is an illustrative transmission response of an LBAW as a function of frequency.

FIGS. 4A-4B illustrate the relationship between standing wave resonance modes and the LBAW bandgap. Referring to FIG. 4A, a portion of LBAW 100 includes two adjacent electrodes 401 and 402 with width W (e.g., corresponding to extensions 150a and 170a of respective electrodes 150 and 170 of FIG. 1A). The bandpass frequency response of LBAW 100 is formed by two (or more) laterally standing resonance modes, 410 and 420, arising in the structure. Lateral standing wave resonance can arise when plate waves are reflected from edges of the adjacent electrodes 401 and 402. In the even mode resonance 410, the piezo layer under both electrodes 150 and 170 vibrates in-phase, whereas in the odd mode resonance 420, the phases are opposite. The even lateral standing wave resonance can arise when the total width of the structure is roughly equal to half of the lateral wavelength $\lambda_\parallel$ of the mode:

$$\frac{\lambda_{even}}{2} = \frac{\lambda_\parallel}{2} \approx 2 \cdot W + G.$$

In the limit of infinitely small gap width G, $\lambda_{even}$ approaches the total width from below. As shown in FIG. 4A, $\lambda_{even}$ gets smaller when G gets larger and gets larger when G gets larger. In case of small gap (e.g., zero-gap) $\lambda_{even}$ gets close to 4 W and in case of a large gap $\lambda_{even}$ gets close to 2 W. The odd lateral standing wave resonance can arise when the width of the electrode is roughly equal to half of the lateral wavelength $\lambda_\parallel$ of the mode:

$$\frac{\lambda_{odd}}{2} = \frac{\lambda_\parallel}{2} \approx W.$$

Referring to FIG. 4B, the even 410 and odd 420 modes are shown as transmission peaks as a function of input frequency f for an LBAW with Type 1 dispersion. For Type 1 dispersion, the even mode 410 has a longer wavelength and is lower in frequency than the shorter-wavelength odd mode 420. The frequency difference 430 between the modes determines the achievable bandwidth of LBAW filter 100, and depends on the acoustic properties of the structure and on the dimensions of IDT resonator 102. Acoustic coupling strength can be defined in terms of the (resonance) frequency difference between even (symmetric) and odd (antisymmetric) resonances:

$$\frac{f_{asymm} - f_{symm}}{f_0},$$

where $f_{symm}$ and $f_{asymm}$ are the symmetric and antisymmetric eigenfrequencies, respectively, and $f_0=(f_{symm}+f_{asymm})/2$ is the center frequency between the two modes.

In some embodiments, increasing the number of extensions (e.g., 150a and 170a) in each electrode (e.g., 150 and 170) can increase the frequency difference between the even and odd mode in the LBAW, and thus increase the bandwidth. This effect can result from the fact that the lateral wavelength of the odd mode can depend on the periodicity of the electrode structure (e.g., width W), while the even mode can depend on the entire width of the structure (e.g., adding up all widths W and gaps G). For example, if the total number of electrode extensions K, the electrode width is W, and the gap width is G, the wavelength $\lambda_\parallel$ of the lateral acoustic wave at the even mode resonance frequency approaches or is slightly shorter than:

$$\frac{\lambda_{even}}{2} \approx K \cdot W + K \cdot G.$$

The odd lateral standing wave resonance in this structure, however, approaches or is slightly larger than:

$$\frac{\lambda_{odd}}{2} \approx W.$$

Additionally, or alternatively, in some embodiments, the total width of the structure $K \cdot W+K \cdot G$ can be such that the highest-order mode trapped in the structure is the desired odd mode resonance. For example, K can be 31, W can be 3 μm, and G can be 2 μm.

In some embodiments, the number of electrode extensions K is between 2 and 200, or between 10 and 60. In some embodiments, the length L of electrode extensions can be between 50 μm and 2000 μm, or between 70 μm and 500 μm.

In some embodiments, the gap G is selected to allow coupling of the evanescent tails of standing waves formed under electrodes 150 and 170. For example, the gap G between electrode extensions can be 0.1 μm and 10 μm, or between 2 μm and 5 μm.

In some embodiments, the topology of the electrodes 150 and 170 can be designed such that the gap width G provides good enough coupling between electrode extensions to create a single even mode 410 across the entire width of the structure. For example, the gap width G can be 2%-300%, or 10%-100% of the evanescent acoustic wave's decay length, i.e. the length at which amplitude $A=A_0 \cdot e^{-1}$ of the original amplitude $A_o$, in the gap at the desired even resonance mode. The gap width G can be optimized. Decreasing the gap to a too small width (1) can eventually pull the even and odd modes too far from each other creating a dip in the passband, (2) can lead to reduced coupling coefficient for the odd mode, or (3) can increase capacitive feed through from finger to finger causing poor out of band attenuation.

In some embodiments, the gap width G can be defined with respect to piezo layer thickness d. For example, G can be designed to be 10% to 300% of d, or 25% to 150% of d.

In some embodiments, the width of electrode extensions W can be between 0.1 μm and 30 μm, or between 2 μm and 5 μm. In some embodiments, W can be designed such that the wavelength $\lambda_\parallel$ of the lateral acoustic wave at the desired odd mode resonance frequency $\lambda_{odd}$ is obtained.

In some embodiments, the electrode width W is designed such that multiple half-wavelengths cannot fit within the electrode width. For example, W can be designed to be smaller than the lateral acoustic wave's wavelength $\lambda_\parallel$ at the desired odd resonance mode, e.g., where $\lambda_\parallel=\lambda_{odd}$.

In some embodiments, the thicknesses of various LBAW 100 components can be selected to achieve various acoustic properties and may be interdependent. For example, the piezo layer 110 thickness d (minimum and maximum value) can first be determined with respect to the acoustic wavelength in the piezo material (λ) at the operation frequency f. In some embodiments, thicknesses (min and max) of the other LBAW 100 layers can be selected based on the choice of piezo thickness d. For example, the combined thickness of the electrodes (including the counter electrode 120) and the piezoelectric layer can be selected to be approximately half a wavelength of the mode that is being used, for example longitudinal bulk wave for the thickness extensional mode. Fundamental modes with N=1 (the first mode, i.e., first harmonic) can allow for greater coupling, but N>1 modes are also possible. For example, the thickness of electrodes 150 and 170, bottom electrode 120, and reflecting structure 130 can be defined as a percentage of piezo layer thickness d. In some embodiments, once all thickness are selected, the geometry of the electrode extensions 150a and 170a, such as number K, width W, and length L, can be tuned to match the LBAW 100 electrical impedance to the system impedance. Without wishing to be bound by theory, impedance matching can help avoid losses and reflections in the system.

In some embodiments, thickness of electrodes 150 and 170 is between 1% to 30% of d, or 5% to 25% of d, or 3% to 15% of d.

In some embodiments, the thickness of bottom electrode 120 is between 5% to 50% of d, or 10% to 30% of d, or 10% to 20% of d.

In some embodiments, where the reflecting structure 130 is a Bragg reflector, the alternative layers of the reflector can be designed such that the required reflectivity of passband wavelengths is obtained. For example, the thickness of each layer can be equal to or less or more than one quarter of the acoustic wavelength $\lambda_z$ in the thickness direction to reflect the odd and even TE1 resonance modes. In some embodiments, a single layer in the Bragg reflector can be 15% to 80% of d, or 20% to 70% of d.

The mass loading of the IDT 102, determined by the thickness and material of electrodes 150 and 170, can be designed such that the frequency difference between the $k_\parallel=0$ frequency of the electrode region's TE1 mode and the outside electrode region's TS2 mode is small. Without wishing to be bound by any particular theory, when the frequency difference between outside region's TS2 mode and electrode region's TE1 mode is small, the trapping range is large. More particularly, the $k_\parallel=0$ frequency of the outside region's TS2 mode can be 95%-99% of the electrode region's TE1 cutoff frequency. The frequency difference between the outside region's TS2 and outside region's TE1 modes' $k_\parallel=0$ frequencies is designed to be large, e.g. 5%-15%, for example 6.5%-7.5%, of the electrode region's TE1 mode cutoff frequency.

According to certain embodiments of the present invention, the $k_\parallel=0$ frequency of the outside region's TS2 mode is greater than, or equal to 98%, or between 98% and 99.5%, or is 98.9% of the electrode region's TE1 cutoff frequency. Similarly, the frequency distance expressed as the frequency difference between electrode region TE1 and outside region TS2 $k_\parallel=0$ frequencies:

$$\frac{\text{electrode } TE1 - \text{outside } TS2}{\text{outside } TS2}$$

should be small, for example on the order of 1%. As an example, said frequency distance can be between 0.2% and 2.1%, or between 0.5% and 1.8%, or between 0.8% and 1.5%, or for example, 1.1%.

Figure 5:
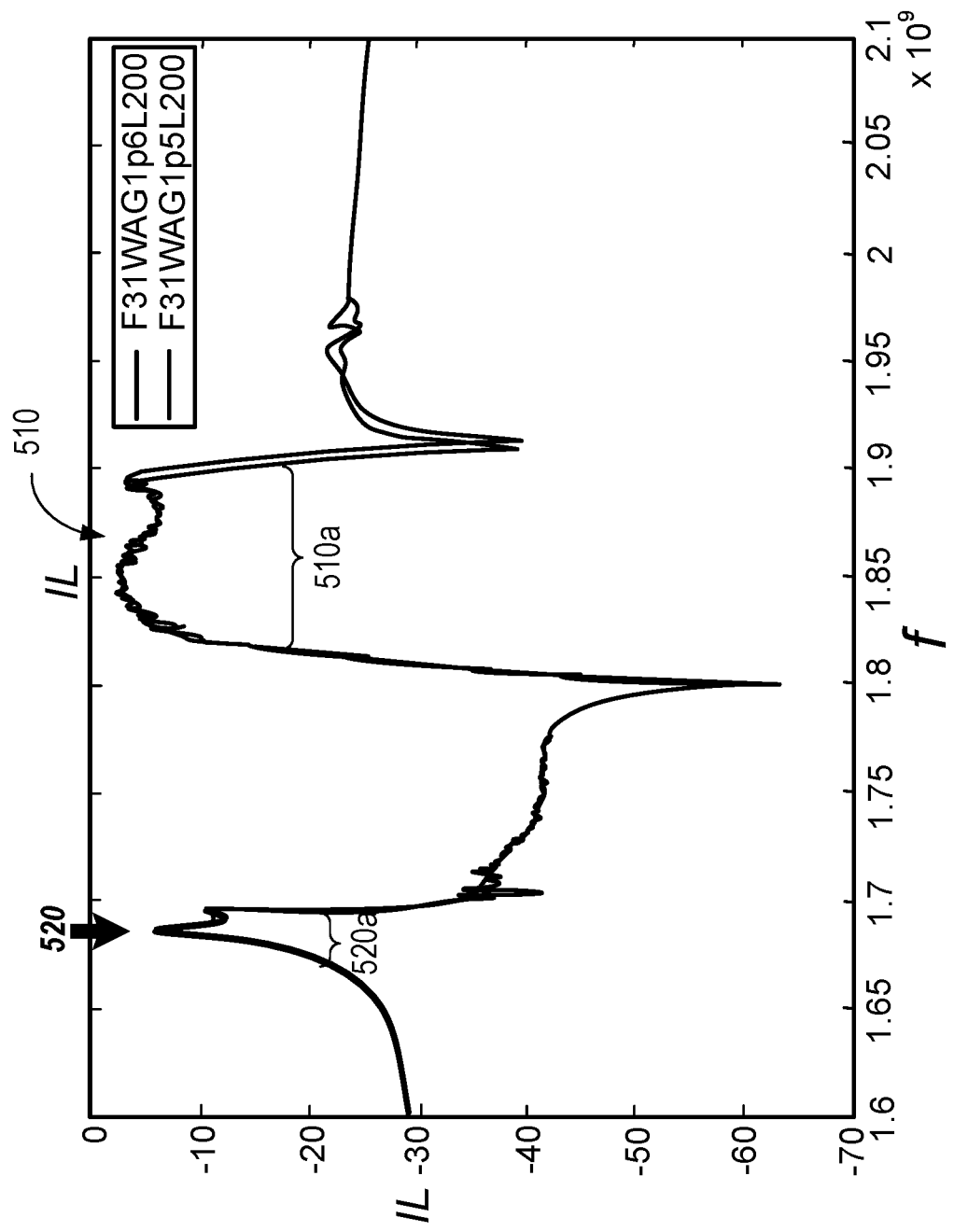
FIG. 5 is an experimental transmission curve of an LBAW as a function of frequency.

FIG. 5 shows a curve of insertion loss IL versus frequency f for an exemplary LBAW 100. The curve shows two passbands with peak 510 corresponding to TE1 waves and peak 520 corresponding to TS2 waves. As discussed above, the width of each passband is determined by the frequency difference of the even and odd modes for the respective type of wave. Here, the TS2 modes correspond to sideband 520a (also referred to herein as "TS2 passband"), and the TE1 modes correspond to passband 510a (also referred to herein as "TE1 passband"). In some embodiments, LBAW 100 is designed to suppress peak 520 corresponding to TS2 modes, while maintaining the properties of peak 510 corresponding to TE1 modes. Without wishing to be bound by any particular theory, TE1 mode operation can be selected because piezo thin film materials have electromechanical coupling that is stronger in the thickness direction. In other words, TE1 longitudinal mode vibrations couple more efficiently to the electrical excitation over the thickness of piezo layer 110.

In some embodiments, LBAW 100 can be designed to have a passband for TE1 modes between 0.5 and 10 GHz, or between 1 and 4 GHz. In some examples, TE1 passband is between 1.8 and 3.7 GHz. The limits of the passband can incorporate design considerations. For example, the dimensions of the device can grow very large or very small. Too large dimensions may take too much space and cause inefficiencies. Too small dimensions can deteriorate performance due to thin and narrow electrodes leading to resistance and losses. In some embodiments, LBAW 100 can be designed to have a TE1 passband width 510a of 0.5-15% relative to center frequency, e.g., 10% relative to center frequency, or 5%, or 2%, or 1%. In some embodiments, the insertion loss at the passband is −7 dB to −0.5 dB or −5 dB to −1.5 dB.

Figure 6:
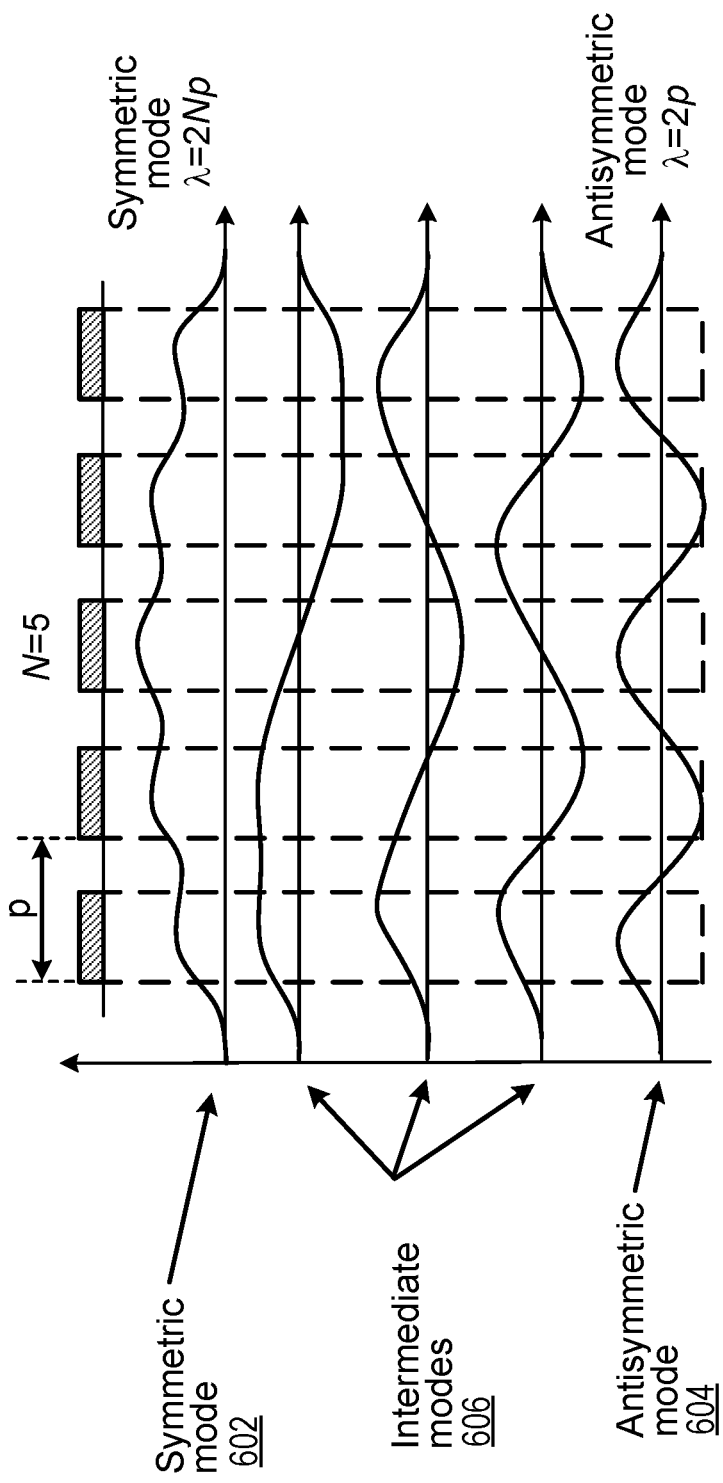
FIG. 6 is a schematic illustration of the different acoustic modes formed under multiple electrode extensions.

Varying the width of extensions or their spacing along the length of the extension can be used to reduce the ripple in the LBAW passband, such as the ripple in the passband 510a shown in FIG. 5 These ripples are in part due to intermediate standing modes that form between IDT electrodes. FIG. 6 is a schematic illustration of some of these modes, where the gray zones represent electrode extensions and the curves represent the amplitude of the acoustic modes forming under the extensions in the LBAW piezo layer. The symmetric 602 and antisymmetric 604 modes can form the frequency boundaries of the passband, while intermediate modes 606 can contribute to the ripple within the passband frequencies.

Figure 7:
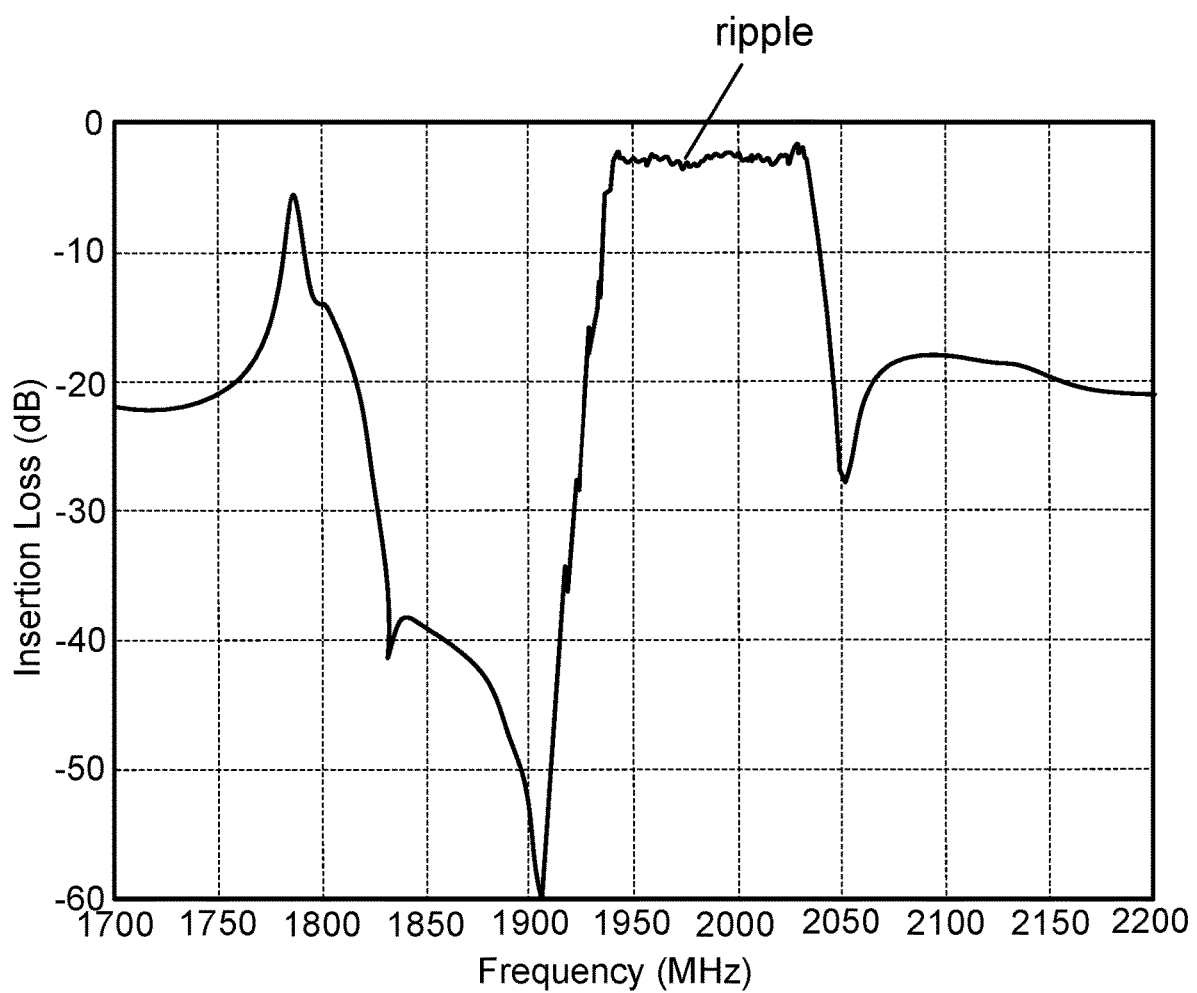
FIG. 7 is an experimental plot of insertion loss versus frequency for an exemplary LBAW.

In contrast, as shown in FIG. 7, by using extension with widths that vary along their lengths, the passband 710 is much flatter. Without wishing to be bound by theory, varying extension width or gap spacing between extensions can cause these intermediate modes to occur at slightly different frequencies between along the length of the extensions, reducing the ripple effect in the passband.

The various embodiments discussed above can be implemented with extensions (e.g., 150a and 170a) that are tapered, or gaps widths G that taper, or a combination of both. Referring to FIG. 8A, a section 800 of interdigitated electrodes 850 and 870 with tapered extensions (e.g., where the width changes from one end to the other) is shown. Electrodes 850 and 870 are physically separated from one another. Referring to FIG. 8B, a full set 820 of interdigitated (fan shaped) comb electrodes (e.g., 850 and 870) with tapered extensions is shown. Electrode 850 has a base 802 and extensions 806 extending from base 802, and electrode 870 has a base 804 and extensions 808 extending from base 804. The extensions from input electrode 850 extend alongside and in generally opposite direction to and separated by a gap width 810 from adjacent extensions of output electrode 870. Extensions 806 have a smaller width 806a in regions distal from base 802, and a larger width 806b in regions proximal to base 802. Conversely, extensions 808 have a larger width 808a in regions distal from base 804, and a smaller width 808b in regions proximal to base 804.

In some embodiments, the width of electrode extensions changes monotonically, e.g., continuously, along the length of the extension between proximal and distal regions. In some embodiments, the width changes in a step-wise manner, or a non-linear manner (e.g., parabolic), or in a randomized manner (e.g., dithered, with increased variation along the finger length). In some embodiments, the width increases or decreases along the length of the extension. In some embodiments, the width of the electrode can change by 10-100% along its length. So the wider end of the extension can be 10-250% wider, e.g., 10-25%, 25-50%, 50-75%, 75-100%, or 100%-250%, wider than the narrower end. In some embodiments, the width of the electrode can change from 10 µm to 15 µm, or 2 µm to 7 µm, or 3 µm to 4 µm or 3.75 µm to 4 µm, depending on the selected bandpass frequency range.

In some embodiments, the gap width remains constant between electrodes from base 802 to base 804. In some embodiments, the gap width is between 0.6 µm and 3 µm, for example 1 µm.

Figure 9A:
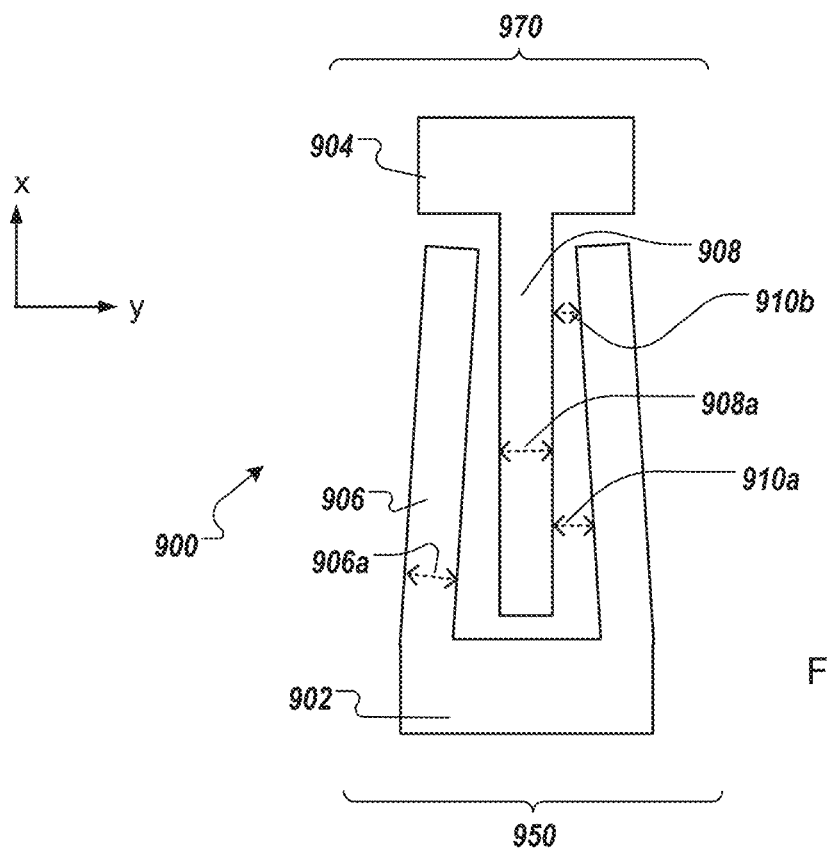
FIG. 9A is a schematic top view of a section of a fan-shaped LBAW electrode with tapered gap width.
Figure 9B:
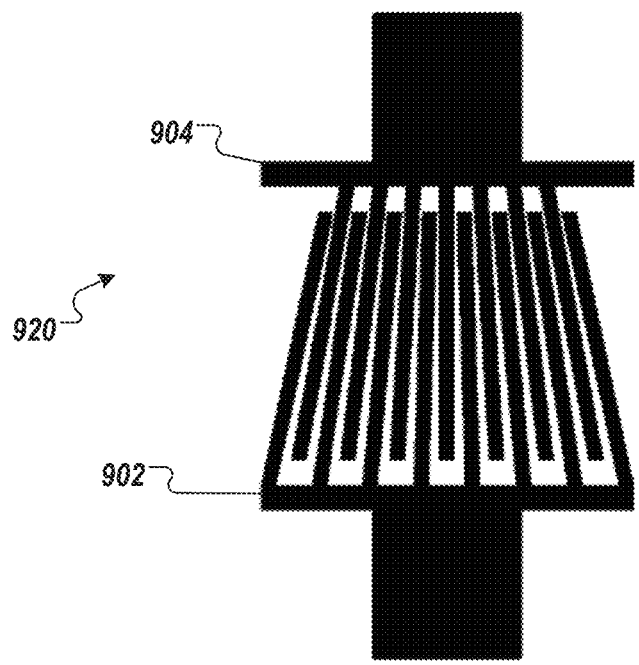
FIG. 9B is a schematic top view of a fan-shaped LBAW electrode with tapered gap width.

Referring to FIG. 9A, a section 900 of interdigitated electrodes 950 and 970 with tapered gap width is shown. Electrodes 950 and 970 are physically separated from one another. Referring to FIG. 9B, a full set 920 of interdigitated comb electrodes (e.g., 950 and 970) with tapered gap width is shown. Electrode 950 has a base 902 and extensions 906 extending from base 902, each with width 906a. Electrode 970 has a base 904 and extensions 908 extending from base 904, each with width 908a. The extensions from input electrode 950 extend alongside and in generally opposite direction to and separated by a gap width from adjacent extensions of output electrode 970. The gap width between adjacent extensions of the input 950 and output 970 electrodes changes between base 902 of the input electrode and base 904 of the output electrode. Adjacent extensions from electrodes 950 and 970 are separated by a larger gap width 910a at a region proximal to base 902 and by a smaller gap width 910b at a region distal to base 902.

For fan shaped electrodes with tapered gap width, the gap width increases or decreases along the length of the gap from one base to the other. In some embodiments, e.g., if the electrodes extension 906, 908 have uniform width along their length, the gap width changes continuously between the bases of the two electrodes (e.g., 902 and 904). In some embodiments, the gap width changes in a step-wise manner. In some embodiments, the gap width can have a change between 0.5 µm and 3 µm, for example 2 µm to 3 µm, or 1.25 µm to 1.75 µm, or 0.75 µm to 2 µm, depending on the selected bandpass frequency range.

In some embodiments, the extension width remains constant along its length. In some embodiments, the extension width is between 1 µm and 30 µm, for example 4 µm.

In embodiments where the gap width G and extension width W are both varied, the ratio G/W is between 0.25 to 5.

Having the width of extensions or the width of the gap between the extensions vary along the length of the gap or extensions, respectively, can be used to select the acoustic properties of an LBAW filter (e.g., change the acoustic properties relative to a filter having extension and gaps both of uniform width along their lengths). For example, interdigitated electrodes can be designed to suppress TS2 sidebands, or other parasitic TS1 sidebands that do not fall into the desired LBAW passband frequency.

Without wishing to be bound by any particular theory, using interdigitated electrodes that vary in extension widths or spacing along their length can be acoustically similar to having a series of parallel connected LBAW filters with constant but different extension widths and spacing. As such, this theoretical series of different LBAW filters can be selected to have TS2 sidebands at different frequencies. Thus, when the LBAW filters are connected in parallel (simulating the effect of a fan shaped LBAW electrode), the TS2 sidebands average out (or "smear" out) between those frequencies and the TS2 band is generally suppressed. The effect on the TE1 passband is weaker because it is a wider band that is less effected by electrode geometry. Similar methods can be used to suppress parasitic TS1 bands. In some embodiments, TS2 sideband suppression takes precedence over TS1 sideband suppression because TS2 sidebands generally introduce higher insertion losses at frequencies closer to the passband of an LBAW filter.

Figure 10A:
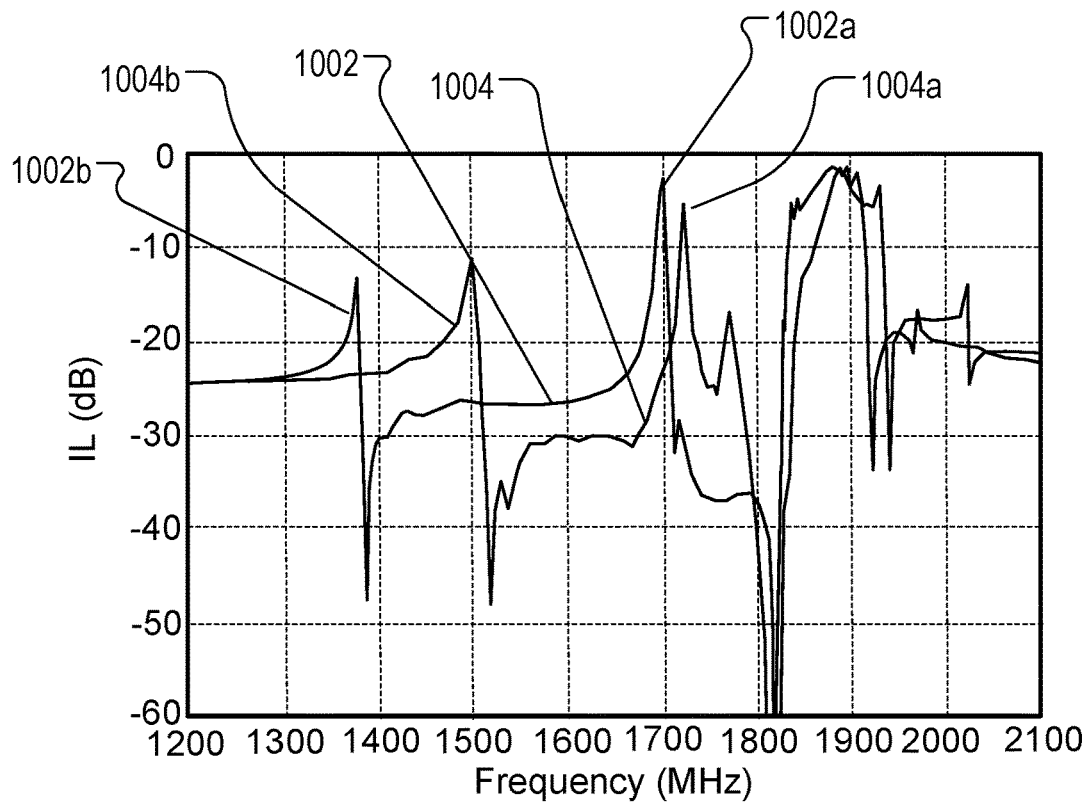
FIG. 10A is a plot of insertion loss versus frequency for two LBAW filters with electrode extensions of constant width and spacing.
Figure 10B:
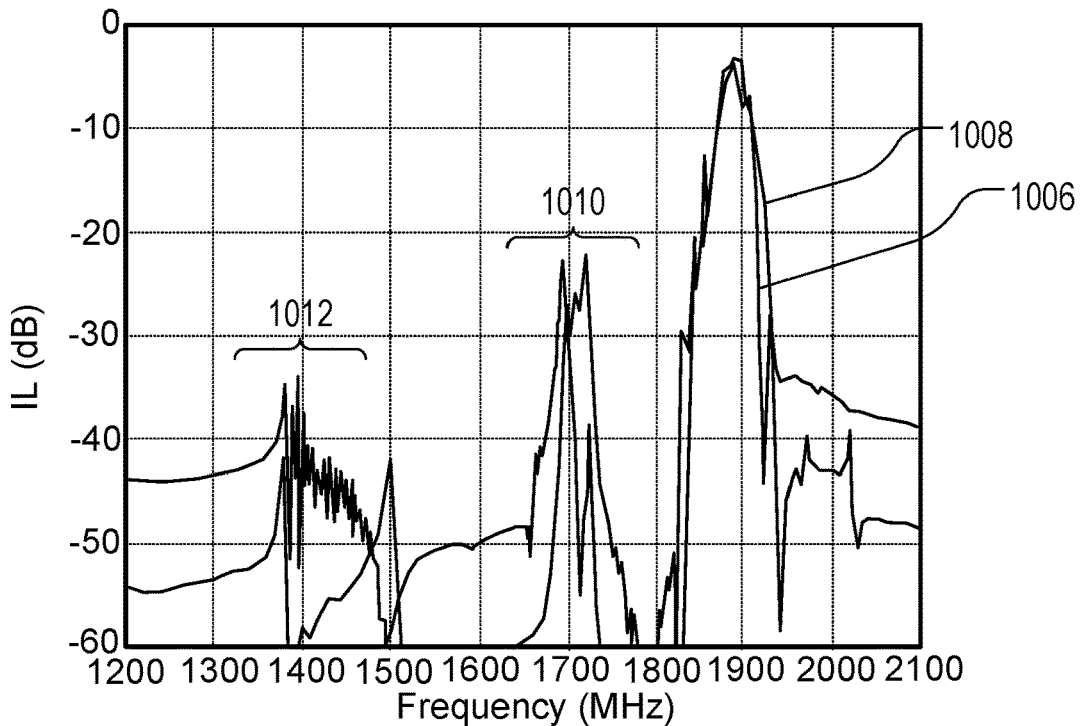
FIG. 10B is a plot of insertion loss versus frequency for the combination of the filters in FIG. 10A.

A proof of concept is shown in FIGS. 10A-10B. FIG. 10A is a plot of measured frequency versus insertion loss for two separate LBAW filters. Curve 1002 corresponds to an LBAW filter with regular interdigitated electrodes having a constant gap width of 1.5 μm and constant extension widths of 3 μm. Curve 1004 corresponds to an LBAW filter with regular interdigitated electrodes having a constant gap width of 1.5 μm and constant extension widths of 4 μm. The TS2 peak 1002a and parasitic TS1 peak 1002b of curve 1002 are located at different frequencies from TS2 peak 1004a and parasitic TS1 peak 1004b of curve 1004.

FIG. 10B shows the resulting curves of frequency versus insertion loss from the combination of the two filters in FIG. 10A. Curve 1006 is synthesized from the measured responses of the filters in FIG. 10A by cascading the filters so that the output of the first filter is connected to the input of the second filter. Curve 1008 is a measured response from a filter similar in geometry (e.g., fan shaped) to the one shown in FIG. 8B, with constant gap width of 1.5 μm and the width of extensions varying from 3 μm to 4 μm along their length. The similarity of curves 1006 and 1008 demonstrates that in-series LBAW filters perform similarly to fan shaped IDT LBAW filters of varying extension width. Moreover, TS2 peaks 1010 and parasitic TS1 peaks 1012 for both curves are significantly lower than for the LBAW filters separately, as shown in FIG. 10A. In sum, fan shaped LBAW electrodes can be effective for sideband suppression.

Figure 11:
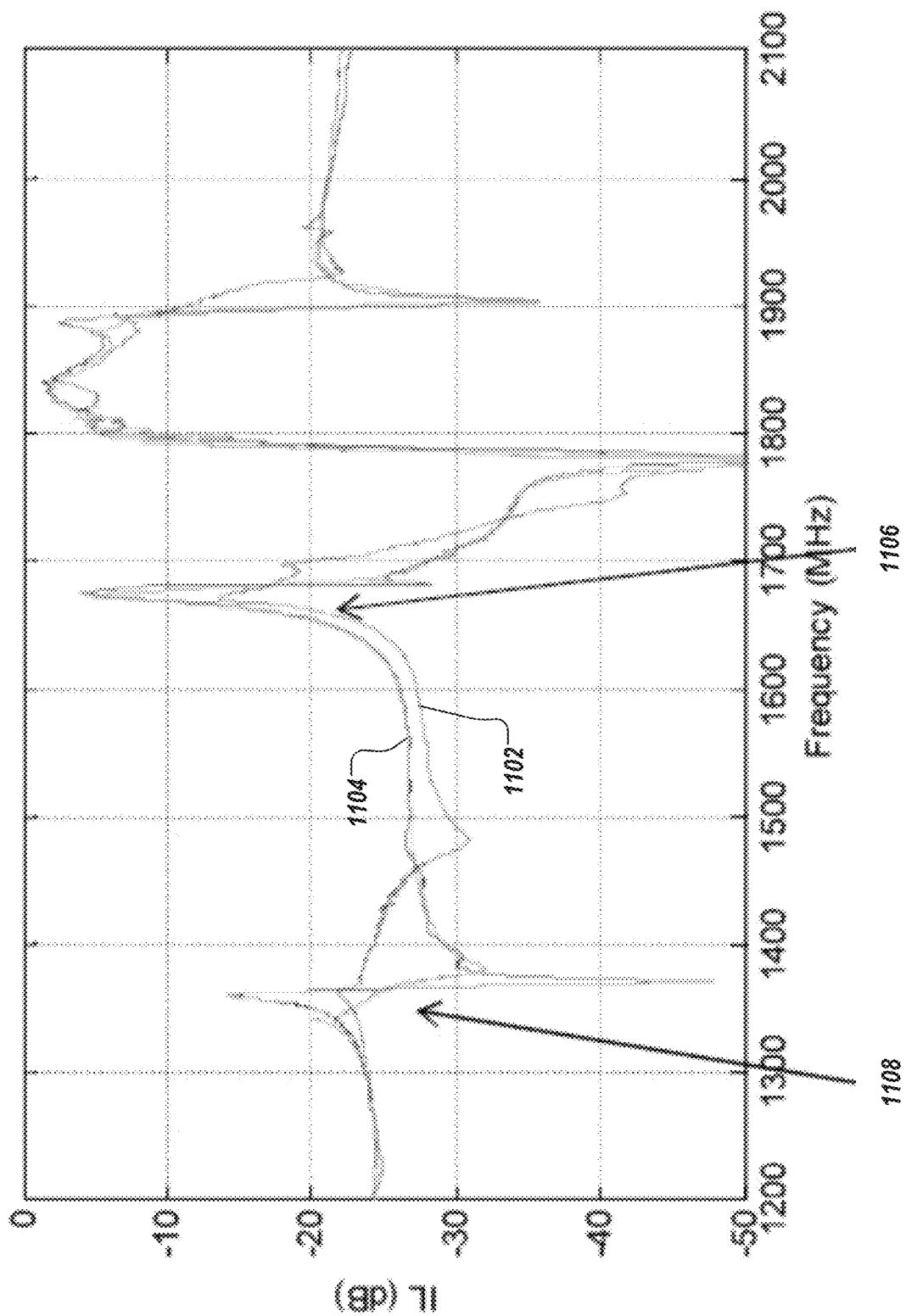
FIG. 11 is a plot of insertion loss versus frequency comparing the performance of an LBAW with electrode extensions of constant width and spacing to an LBAW with a fan shaped electrode with tapered extensions.

FIG. 11 shows additional experimental confirmation that fan shaped electrode extensions of varying (tapered) width can be used to suppress sidebands in a plot of frequency versus insertion loss. Measured curve 1104 corresponds to a regular LBAW filter with interdigitated electrodes having a constant gap width of 1.5 μm and constant extension widths of 4 μm. Measured curve 1002 for the fan shaped LBAW electrode corresponds to interdigitated fan shaped electrodes with constant gap width of 1.5 μm and extension widths varying from 3 μm to 4 μm. Curve 1002 has measurably lower insertion loss for the TS2 peak 1106 and parasitic TS1 side peak 1108. The width and insertion loss of the passband can be optimized by conventional methods.

The effect of different electrode geometries can be predicted by simulation. In some embodiments, a continuously varying electrode width can be approximated by dividing the electrode into multiple sections (e.g., 3 section) and summing the result.

Figure 12:
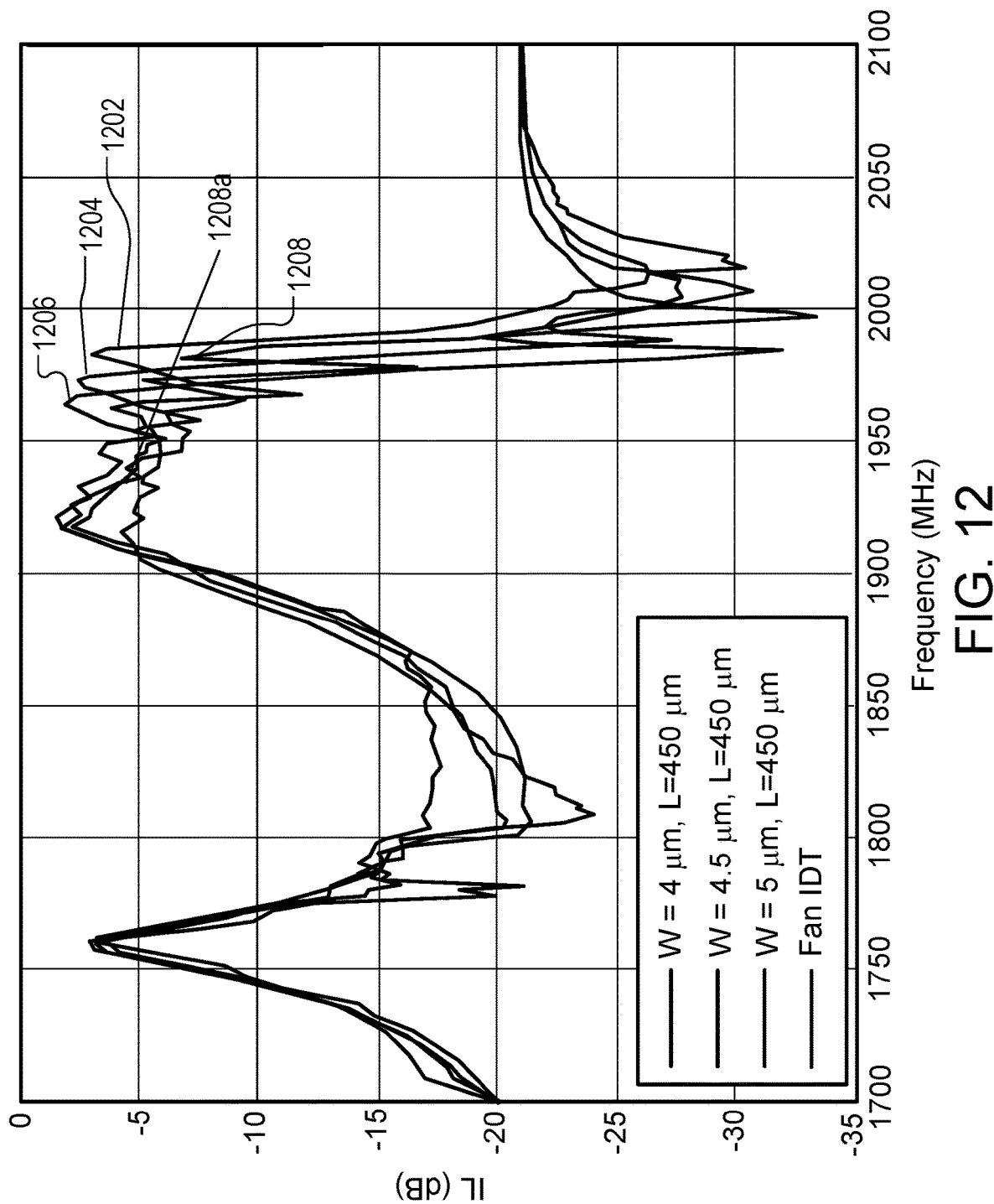
FIG. 12 is a plot of insertion loss versus frequency comparing the performance of LBAW filters with electrode extensions of constant width and spacing to an LBAW with a fan shaped electrode.

Referring to FIG. 12, simulated insertion loss versus frequency curves are shown for three regular LBAW electrode geometries versus a fan-shaped LBAW electrode geometry. Curves 1202, 1204, and 1206 correspond to regular LBAW geometries of 2 μm gap width and 10 extensions each with constant extension widths of 4 μm, 4.5 μm, and 5 μm respectively. Curve 1208 corresponds to an LBAW with a fan-shaped IDT electrode of extension widths varying from 4 μm to 5 μm along the length of the extension, with a 2 μm gap width between extensions. Curve 1208 is formed by combining the three other curves to approximately simulate a tapered LBAW structure. As predicted, the lower frequency region 1208a of curve 1208 shows a reduction of ripple in the passband between 1920 MHz and 1940 MHz.

What is claimed is:

1. An acoustic wave filter device comprising:
a piezoelectric layer;
an input electrode and an output electrode located on a top surface of the piezoelectric layer and physically separated from one another, the input and the output electrodes each including a base and one or more extensions extending from the base, the one or more extensions of the input electrode extending alongside and in a generally opposite direction to and separated by a gap width from an adjacent extension of the one or more extensions of the output electrode; and
a counter electrode having a top surface connected to a bottom surface of the piezoelectric layer,
wherein a thickness of the piezoelectric layer and the gap width between adjacent extensions of the input and output electrodes are such that application of a radio frequency voltage between the input electrode and the counter electrode creates symmetric and antisymmetric acoustic thickness-extensional resonance modes in the piezoelectric layer, and
wherein at least one extension in the one or more extensions of the input or the output electrodes has a width that changes from a first end of the at least one extension to a second end of the at least one extension such that the width increases by between 10% and 250% from the first end to the second end.

2. The device of claim 1, wherein the first end of the at least one extension is distal from the base of the corresponding electrode and the second end of the at least one extension is proximal to the base of the corresponding electrode.

3. The device of claim 1, wherein the first end of the at least one extension is proximal to the base of an electrode corresponding to the at least one extension and the second end of the at least one extension is distal from the base of the electrode corresponding to the at least one extension.

4. The device of claim 3, wherein an extension adjacent to the at least one extension has a width that increases from a third end of the adjacent extension to a fourth end of the adjacent extension, wherein the third end is distal from the base of an electrode corresponding to the adjacent extension, and the fourth end is proximal to the base of the electrode corresponding to the adjacent extension.

5. The device of claim 4, wherein the at least one extension is an extension of the input electrode, and the adjacent extension is an extension of the output electrode.

6. The device of claim 1, wherein the device is a laterally coupled bulk acoustic wave filter.

7. The device of claim 1, wherein the gap width between extensions is constant.

8. The device of claim 1, wherein the width of the at least one extension changes continuously from the first end of the at least one extension to the second end.

9. The device of claim 1, wherein the input and output electrodes each have a comb structure with interdigitated extensions.

10. The device of claim 1, further including a Bragg reflector in contact with a bottom surface of the counter electrode.

11. The device of claim 1, wherein the input and output electrodes have at least 10 extensions in total.

12. The device of claim 1, wherein the thickness of the piezoelectric layer is at least 0.5 µm.

13. The device of claim 1, wherein a respective width of each extension of an electrode corresponding to the at least one electrode increases by between 10% and 250% from the first end to the second end.

14. The device of claim 1, wherein a respective width of each extension of an electrode corresponding to the at least one electrode increases by between 25% and 100% from the first end to the second end.

15. An acoustic wave filter device comprising:
a piezoelectric layer;
an input electrode and an output electrode located on a top surface of the piezoelectric layer and physically separated from one another, the input and the output electrodes each including a base and at least one extension extending from the base, the at least one extension of the input electrode extending alongside and in a generally opposite direction to and separated by a gap width from an adjacent extension of the at least one extensions of the output electrode; and
a counter electrode having a top surface connected to a bottom surface of the piezoelectric layer,
wherein a thickness of the piezoelectric layer and the gap width between adjacent extensions of the input and output electrodes are such that application of a radio frequency voltage between the input electrode and the counter electrode will create symmetric and antisymmetric acoustic thickness-extensional resonance modes in the piezoelectric layer, and
wherein the gap width between adjacent extensions of the input and output electrodes has a difference of 0.5 µm to 3 µm in width when moving in a direction from the base of the input electrode towards the base of the output electrode.

16. The device of claim 15, further including a Bragg reflector in contact with a bottom surface of the counter electrode.

17. The device of claim 15, wherein the gap width between adjacent extensions of the input and output electrodes increases when moving in the direction from the base of the input electrode towards the base of the output electrode.

18. The device of claim 17, wherein the gap width between adjacent extensions of the input and output electrodes increases for 2 µm to 3 µm.

19. The device of claim 15, wherein the gap width between adjacent extensions of the input and output electrodes decreases when moving in the direction from the base of the input electrode towards the base of the output electrode.

20. The device of claim 15, wherein the input and output electrodes each have a comb structure with interdigitated extensions.

* * * * *